(12) United States Patent (10) Patent No.: US 12,598,938 B2
Geissler et al. (45) Date of Patent: Apr. 7, 2026

(54) DEVICE FOR DRYING SEMICONDUCTOR SUBSTRATES

(71) Applicant: SILTRONIC AG, Munich (DE)

(72) Inventors: Sebastian Geissler, Brand-Erbisdorf (DE); Simon Rothenaicher, Erlbach (DE)

(73) Assignee: SILTRONIC AG, Munich (DE)

( * ) Notice: Subject to any disclaimer, the term of this patent is extended or adjusted under 35 U.S.C. 154(b) by 910 days.

(21) Appl. No.: 17/784,117

(22) PCT Filed: Nov. 27, 2020

(86) PCT No.: PCT/EP2020/083652
§ 371 (c)(1),
(2) Date: Jun. 10, 2022

(87) PCT Pub. No.: WO2021/121901
PCT Pub. Date: Jun. 24, 2021

(65) Prior Publication Data
US 2023/0016276 A1 Jan. 19, 2023

(30) Foreign Application Priority Data
Dec. 18, 2019 (EP) ..................................... 19217346

(51) Int. Cl.
*H01L 21/67* (2006.01)
(52) U.S. Cl.
CPC ............................... *H01L 21/67034* (2013.01)
(58) Field of Classification Search
CPC ................................................ H01L 21/67034

USPC ............................................................ 34/239
See application file for complete search history.

(56) References Cited

U.S. PATENT DOCUMENTS

| 2,158,695 A | * | 5/1939 | Foss | .......................... B44C 7/08 |
| | | | | 15/245 |
| 2003/0145874 A1 | | 8/2003 | Myland | |
| 2007/0094886 A1 | * | 5/2007 | Ettinger | ............ H01L 21/67034 |
| | | | | 34/239 |
| 2007/0157951 A1 | | 7/2007 | Windley et al. | |
| 2010/0078867 A1 | | 4/2010 | Nakashima | |
| 2015/0122291 A1 | | 5/2015 | Yen et al. | |

FOREIGN PATENT DOCUMENTS

| CN | 1045539 A | 9/1990 |
| CN | 107845590 A | 3/2018 |
| DE | 102014207266 A1 | 10/2015 |

(Continued)

OTHER PUBLICATIONS

K.V. Mahesh, S. Balanand, R. Raimond, A. Peer Mohamed, S. Ananthakumar, Polyaryletherketone polymer nanocomposite engineered with nanolaminated Ti3SIC2 ceramic fillers, Materials & Design, vol. 63, pp. 360-367, ISSN 0261-3069, (Year: 2014).*

*Primary Examiner* — Connor J Tremarche
(74) *Attorney, Agent, or Firm* — LEYDIG, VOIT & MAYER, LTD.

(57) ABSTRACT

A device is for drying disc-shaped substrates. The device has an elongated body, which tapers upwards to form a wedge having an angle α between two upper surfaces and an upper edge. The upper edge is configured to support a disc-shaped substrate. An upper surface of the two upper surfaces has a groove having an increasing groove depth with increasing distance from the upper edge.

11 Claims, 1 Drawing Sheet

(56)                   References Cited

FOREIGN PATENT DOCUMENTS

| EP | 0385536 | A1 | 9/1990 |
| JP | 2008049073 | A | 3/2008 |
| JP | 2009510799 | A | 3/2009 |
| JP | 2010275846 | A | 12/2010 |

* cited by examiner

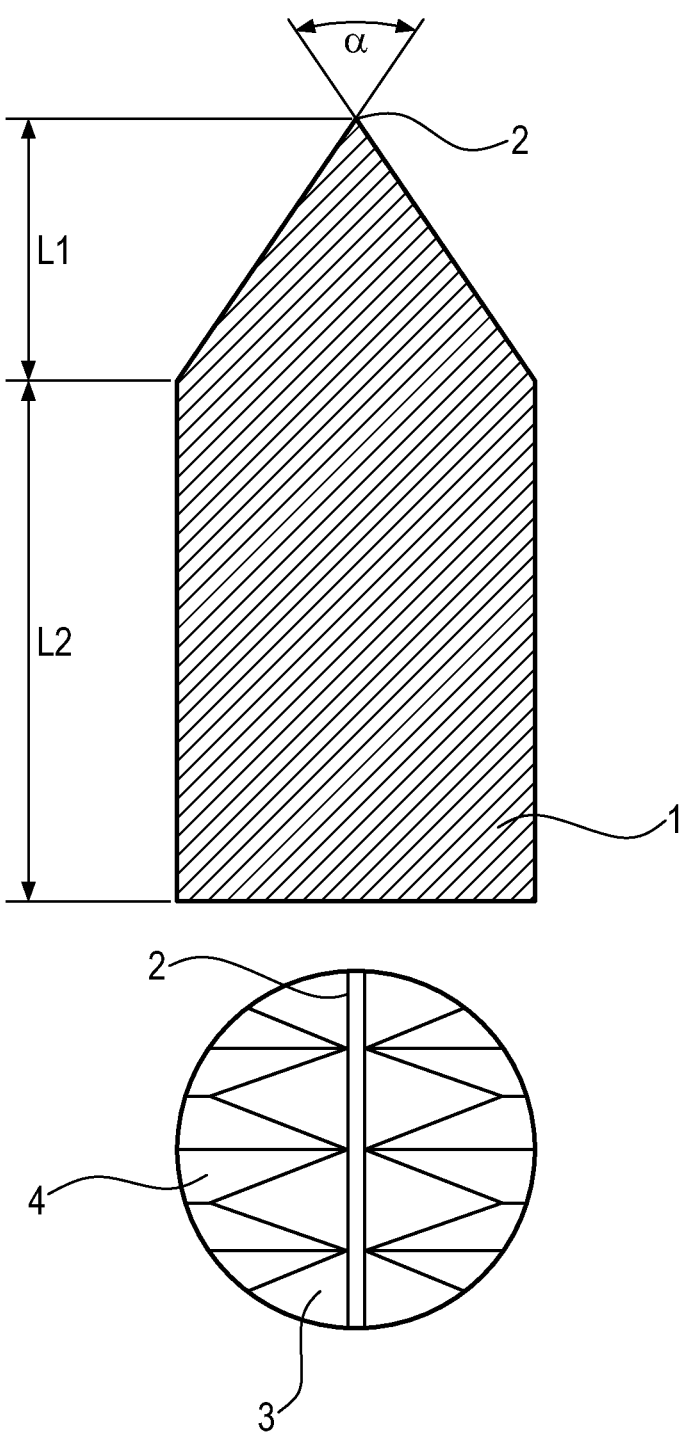

DEVICE FOR DRYING SEMICONDUCTOR SUBSTRATES

CROSS REFERENCE TO RELATED APPLICATIONS

This application is a U.S. National Phase application under 35 U.S.C. § 371 of International Application No. PCT/EP2020/083652, filed on Nov. 27, 2020, and claims benefit to European Patent Application No. 19217346.6, filed on Dec. 18, 2019. The International Application was published in English on Jun. 24, 2021 as WO 2021/121901 A1 under PCT Article 21(2).

FIELD

The present disclosure relates to a device for use in drying semiconductor substrates.

BACKGROUND

Semiconductor wafers may be treated by a method such that the wafers are immersed for some time in a bath containing a liquid and are then taken therefrom so slowly that practically the whole quantity of liquid remains in the bath.

A method of this kind may be used, for example, in the manufacture of electric circuits on all kinds of substrates, such as, for example, integrated circuits on semiconductor wafers (for example of silicon), drives for liquid crystal displays on transparent plates of glass or quartz or circuits on plates of synthetic material (circuit boards). The method may also be used in the manufacture of shadow masks for television picture tubes or in the manufacture of CD or VLP records. In all these cases, the substrates are immersed many times for some time in a bath containing a liquid, for example in galvanic baths for deposition of metals, in etching baths for etching patterns into metal layers or into semiconductor material, in development baths for developing exposed photo lacquer layers and in rinsing baths for cleaning the substrates. After treatment in the liquid baths, the substrates are taken from the liquid and are dried. The substrates can be taken from the liquid in that they are lifted or withdrawn from the liquid, but of course also in that the liquid is caused to flow out of the bath.

While being taken from the bath, the semiconductor wafer resides on a device that is used to hold the semiconductor wafer in place. During this process, a problem can arise such that residues of liquid remain at the edge of the substrate. This can lead to unwanted particles on the edge of the substrate, which are later on effecting the quality of the semiconductor wafer.

The physical effect utilized thereby are described in CN1045539 A (EP 03 855 36 A1), as is an apparatus which is to some extent suitable for conduction of the method.

A device and a method to improve the quality of cleaning in respect to remaining particles of the semiconductor wafer is given in DE 10 2014 207 266 A1. However, using this there are still particles left that reduce the quality of the semiconductor wafers.

SUMMARY

In an embodiment, the present disclosure provides a device that is for drying disc-shaped substrates. The device has an elongated body, which tapers upwards to form a wedge having an angle α between two upper surfaces and an upper edge. The upper edge is configured to support a disc-shaped substrate. An upper surface of the two upper surfaces has a groove having an increasing groove depth with increasing distance from the upper edge.

BRIEF DESCRIPTION OF THE DRAWINGS

Subject matter of the present disclosure will be described in even greater detail below based on the exemplary FIGURE. All features described and/or illustrated herein can be used alone or combined in different combinations. The features and advantages of various embodiments will become apparent by reading the following detailed description with reference to the attached drawing, which illustrates the following:

FIG. 1 shows a device (disc holder) according to an aspect of the present disclosure.

DETAILED DESCRIPTION

The present disclosure relates to a device being used to treat semiconductor wafers, in which the wafers are immersed for some time in a bath containing a liquid, and are then taken therefrom so slowly that practically the whole quantity of liquid remains in the bath.

In an embodiment, the present disclosure improves said device, and more particularly reduces the number of particles, which are found on the dried substrates.

FIG. 1 shows a device (disc holder) according to an aspect of the present disclosure.

The device for drying disc-shaped substrates comprises an elongated body (1), which tapers upwards to form a wedge having an angle α between two upper surfaces and the upper edge (2). The upper edge (2) is suitable for a disc-shaped substrate to be supported on.

L1 is the height of the wedge and L2 is the length of the support part.

The upper surface (3) comprises a groove (4) having an increasing groove depth with increasing distance from the upper edge (2). Preferably, the groove is a triangular groove.

Preferably, the wedge opening angle α is larger than 30° and smaller than 90°, preferably more than 50° and less than 70°.

Preferably, the material used for the device comprises ceramic filled polyetheretherketone (CFM PEEK).

Preferably, the curvature radius of the upper edge is not less than 0.1 mm and not more than 1 mm.

Preferably, the two surface are hydrophobic.

Preferably, the maximum groove depth is not less than 1 mm and not more than 5 mm.

Preferably, an upper surface (3) comprises not less than 3 grooves (4).

Preferably, the groove (4) has a triangular shape.

Preferably, the opening angle of the triangular shape of a groove is not less than 80 mm and not more than 100 mm.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS
EMPLOYED

L1 Height of the wedge formed on top of the elongated body
L2 Height of the support part
1 Elongated body
2 Upper edge of the elongated body
3 Upper Surface
4 Chamfering diameter of the elongated body.
α Opening angle of the wedge, angle between the upper two surfaces and an upper edge

The invention claimed is:

1. A device for drying disc-shaped substrates, the device comprising:
   an elongated body, which tapers upwards to form a wedge having an angle α between two upper surfaces and an upper edge,
   wherein the upper edge is configured to support a disc-shaped substrate, and
   wherein an upper surface of the two upper surfaces comprises a groove having an increasing groove depth with increasing distance from the upper edge.

2. The device according to claim 1, wherein the wedge opening angle α is larger than 30° and smaller than 90°.

3. The device according to claim 1, wherein the device comprises ceramic filled polyetheretherketone (CFM PEEK).

4. The device according to claim 1, wherein a curvature radius is not less than 0.1 mm and not more than 1 mm.

5. The device according to claim 1, wherein a maximum groove depth is not less than 1 mm and not more than 5 mm.

6. The device according to claim 1, wherein the upper surface comprises not less than 3 grooves.

7. The device according to claim 1, wherein the groove has a triangular shape.

8. The device according to claim 7, wherein an opening angle of the triangular shape of the groove is not less than 80° and not more than 100°.

9. The device according to claim 1, wherein the wedge opening angle α is larger than 50° and smaller than 70°.

10. A device for drying a disc-shaped semiconductor wafer, the device comprising:
   an elongated body, which tapers upwards to form a wedge having an angle α between two upper surfaces and an upper edge,
   wherein the upper edge is configured to support the disc-shaped semiconductor wafer,
   wherein an upper surface of the two upper surfaces comprises a groove having an increasing groove depth with increasing distance from the upper edge,
   wherein a curvature radius of the upper edge is not less than 0.1 mm and not more than 1 mm,
   wherein the increasing groove depth has a maximum groove depth of not less than 1 mm and not more than 5 mm, and
   wherein an opening of the groove has a triangular shape and an opening angle of the opening is not less than 80 mm and not more than 100 mm.

11. A method of treating a disc-shaped semiconductor wafer, the method comprising:
   removing the semiconductor wafer from a bath containing a liquid while the semiconductor wafer resides on a device for drying the disc-shaped semiconductor wafer, the device comprising: an elongated body, which tapers upwards to form a wedge having an angle α between two upper surfaces and an upper edge, the upper edge is configured to support the disc-shaped semiconductor substrate, and an upper surface of the two upper surfaces comprises a groove having an increasing groove depth with increasing distance from the upper edge.

* * * * *